(12) United States Patent
Salowe et al.

(10) Patent No.: US 8,065,652 B1
(45) Date of Patent: Nov. 22, 2011

(54) METHOD AND SYSTEM FOR DETERMINING HARD AND PREFERRED RULES IN GLOBAL ROUTING OF ELECTRONIC DESIGNS

(75) Inventors: Jeffrey Scott Salowe, Cupertino, CA (US); Charles T. Houck, Lancaster, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 530 days.

(21) Appl. No.: 11/838,195

(22) Filed: Aug. 13, 2007

(51) Int. Cl.
*G06F 17/50* (2006.01)
*G06F 15/04* (2006.01)

(52) U.S. Cl. ........ 716/139; 716/118; 716/119; 716/120; 716/121; 716/122; 716/126; 716/127; 716/128; 716/129; 716/130

(58) Field of Classification Search ............... 716/7–15, 716/118–122, 126–130, 139
See application file for complete search history.

(56) References Cited

U.S. PATENT DOCUMENTS

| | | | |
|---|---|---|---|
| 6,446,246 B1 * | 9/2002 | Suto | 716/112 |
| 6,957,407 B2 * | 10/2005 | Suto | 716/130 |
| 7,062,737 B2 * | 6/2006 | Tetelbaum et al. | 716/113 |
| 7,072,815 B1 | 7/2006 | Chaudhary et al. | |
| 7,257,797 B1 | 8/2007 | Waller et al. | |
| 2002/0046389 A1 | 4/2002 | Hirakimoto et al. | |
| 2004/0015803 A1 | 1/2004 | Huang et al. | |
| 2004/0221253 A1 * | 11/2004 | Imper et al. | 716/13 |
| 2007/0245280 A1 * | 10/2007 | Van Eijk et al. | 716/9 |
| 2008/0250376 A1 | 10/2008 | Burch et al. | |
| 2009/0055782 A1 | 2/2009 | Fu et al. | |
| 2009/0172628 A1 * | 7/2009 | Chyan et al. | 716/13 |

OTHER PUBLICATIONS

Kao et al., Cross point Assignment with Global Rerouting for General-Architecture Design, 1995, IEEE, pp. 337-348.*
Leong, H.K.-S Advanced routing in changing technology landscape. Proc. 2003 International Symposium on Physical Design, 2003, 118-121.
Linsker, R. An iterative-improvement penalty-function-driven wire routing system. IBM Journal of Research and Development, 28(5), 1984, 613-624.
Nair, R. A simple yet effective technique for global wiring. IEEE Transactions on CAD, 6(2) 1987, 165-172.
Non-Final Office Action dated Oct. 5, 2010 for U.S. Appl. No. 11/964,639.
"Define Polygon As Region", Virtuoso Chip Assembly Router User Reference for ICC, Product Version 11.2.41.03, 2005.
"Define Region by Coordinates", Virtuoso Chip Assembly Router User Reference for ICC, Product Version 11.2.41.03, 2005.
"Define Region", Virtuoso Chip Assembly Router User Reference for ICC, Product Version 11.2.41.03, 2005.
"Define Region Forget", Virtuoso Chip Assembly Router User Reference for ICC, Product Version 11.2.41.03, 2005.

(Continued)

*Primary Examiner* — Nghia Doan
(74) *Attorney, Agent, or Firm* — Vista IP Law Group LLP

(57) ABSTRACT

Various embodiments of the invention comprise methods and systems for determining when or whether to use hard rules or preferred rules during global routing of an electronic design. In some embodiments, the entire routable space is first routed with hard rules during global routing while ensuring the design may be embedded. The design is then analyzed with preferred rules where the overcongested areas are marked as "use hard rule" and areas not overcongested are marked as "use preferred rule." The methods or the systems thus ensure that the design remains routable throughout the process while improving timing, manufacturability, or yield by reserving routing space for the preferred rules.

53 Claims, 8 Drawing Sheets

OTHER PUBLICATIONS

"Draw Region Menu", Virtuoso Chip Assembly Router User Reference for ICC, Product Version 11.2.41.03, 2005.

"Draw Region Mode", Virtuoso Chip Assembly Router User Reference for ICC, Product Version 11.2.41.03, 2005.

"Regions Report", Virtuoso Chip Assembly Router User Reference for ICC, Product Version 11.2.41.03, 2005.

"Report Specify Regions", Virtuoso Chip Assembly Router User Reference for ICC, Product Version 11.2.41.03, 2005.

"Using Area Rules", Virtuoso Chip Assembly Router User Reference for ICC, Product Version 11.2.41.03, 2005.

Non-Final Office Action dated Apr. 18, 2011 for U.S. Appl. No. 11/964,639.

* cited by examiner

METHOD AND SYSTEM FOR DETERMINING HARD AND PREFERRED RULES IN GLOBAL ROUTING OF ELECTRONIC DESIGNS

BACKGROUND AND SUMMARY

In electronic designs, placement determines the locations of each active element of an IC, and routing is the process of creating all the wires needed to properly connect all the placed components, while obeying the design rules of the process. The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

One of the early routing algorithms is the Lee algorithm, which is also commonly called the maze routing algorithm. The Lee algorithm is known to find a route if one exists. Nonetheless, the Lee algorithm is also known to be slow and memory intensive. As such, the application of Lee algorithm to electronic designs over a certain size is oftentimes impractical. One widely adopted solution for the impracticality of the Lee algorithm is the introduction of a two-level global routing, which decides the rough route for each net, followed by detailed routing. As global routing is performed on coarse grids to determine an approximate route for each wire, it is much faster than pure maze routing under the Lee algorithm. In addition to determining the rough route for each net, the objectives of global routing are typically to minimize the routing congestion and the total wirelength. After the global routing is complete, each area defined by each grid is then detailed routed.

Additionally, global routing is much faster than detailed routing and also gives good indication of the difficulty of the detailed routing problem by producing congestion maps. The degree of congestion of a g-cell may be expressed as a ratio of the routing demand to the routing capacity. It should be noted that a g-cell is also called as a global routing cell and constitutes a routing area defined by a coarse routing grid. Where there are only a few overcongested g-cells, the detailed routing may still complete by using techniques such as detours through neighboring squares or wrong-way routing which avoids the capacity limits. If there is a large number of overcongested g-cells the detailed routing may fail. Many global routers today are based upon an initial route of all nets followed by a rip-up and re-route procedure which attempts to reduce the congestion by re-routing segments of nets on overloaded edges.

Recent development in global routing adopts the methodology that, during global routing, all wires are mapped onto a coarse grid comprising larger g-cells subject to certain capacity constraints. The usual medium of communication between the IC design engineers and the foundry is through a set of design rules. These rules in the presence of RET and other manufacturing constraints have become overly restrictive. Currently, most of the design rules are hard and "digital" constraints with a few exceptions such as the timing rules; that is, these design rules must be either obeyed or violated. The design engineers are thus given a set of these design rules to comply with in devising the physical design. The foundry then evaluates how many of these design rules are violated in a particular design and returns an estimated yield based on the degree of compliance with the entire set of design rules. Moreover, since the design rules are oblivious of the design requirements or the design intent of any particular electronic circuit designs, non-selective adoption of all of the design rules are usually overly pessimistic. The prior solutions to these hard design rules have focused on the detailed routers.

Chip designers use both hard and preferred design rules. A hard rule is one that must be obeyed; a preferred rule is one that improves factors such as timing, manufacturability, or yield, but it need not be strictly obeyed. Typically, a preferred rule asks a router to make more space for wires and vias than the hard rule would. It may be impossible to route a chip using only the preferred rule because of the extra area involved. The router must decide when to honor the hard rule and when to use the preferred rule.

The design rules may be categorized into two types. The first type is called hard rules which are the design rules that must be obeyed for the IC design. The second type is called soft rules or preferred rules which improve one or more factors such as timing, manufacturability, or yield but are not required to be always met. These design rules are usually imposed by the IC fabrication processes or by performance optimization techniques. The preferred rules typically ask a router to make more space for wires and vias than the hard rules do. Nonetheless, such requests for more space for wires may render routing impossible at times because of the extra space requested. One common problem which a router faces is when both the hard rules and the preferred rules are present. Prior routing algorithms require the router to determine when to honor the hard rules and when to use the preferred rules. One prior approach is to handle the issues during detailed routing only which involves techniques such as rip-up and reroute. Another prior approach is to proceed through detailed routing and then mark certain regions as "use hard rule" based on detailed routing violations. This latter approach has oftentimes been conducted manually. The shortcoming of waiting until detailed routing is that adequate routable space is not reserved early in the process so opportunities to apply the preferred rules may be lost.

On the other hand, these increasingly complex design rules impact detailed routing, and the loss in design tool quality and productivity have resulted in increased project uncertainty and manufacturing non-recurring engineering costs (NRE costs). As the global router generally guides the detailed router and as the integrated circuit designs have become more intricate, design rules imposed by the processing or manufacturing techniques and performance optimization techniques govern the spacing and sizing of the wires. As a result, global routing has grown increasingly more complex as the integrated circuit designs and the manufacturing processes advance. For example, the representation of g-cells by simple squares with capacities have been, in many cases, replaced by representations with capacities per layer and per direction, and via capacity per layer pair.

As another example, in deep sub-micron regime, resolution enhancement techniques (RET) such as OPC (optical proximity correction) and PSM (phase shift mask) may also make routing more complicated as OPC and RET may create additional design rule violations as more wires will become fat wires. More specifically, routers are generally to observe OPC rules, especially on lower metal layers where terminals reside; this is especially important as routers may combine polygons to connect wires to pins. Also, OPC rules may produce more wiring and hence causes spacing and congestion problems. Furthermore, in incorporating the PSM technologies, phase assignment by router may also cause spacing as well as width issues. In addition, off-axis illumination (OAI) rules may produce more wiring and hence causes more spacing and congestion problems. All these RET technologies present more challenges to the global routers.

In the sub-wavelength regime, 193 nm lithography is still used in 130 nm or even 65 nm features. RET is thus significantly extended to fabricate devices with dimensions of 90 nm or less. OAI typically directs light at the photomask only at certain angles to enhance resolution of dense pitches and small features. OPC makes small alterations to the features to reduce variations in the printed features. PSM creates phase difference to enhance resolution. However, these RET techniques also cause negative impact on routing. For example, a pure-router based solution to meet the antenna rule is to limit the amount of metal connected to gate. This, however, creates more wiring, vias, and thus congestion. Another example is the design rules which make minimum line spacing a function of both the wire width and length. A wider wire will influence the spacing rule within its surroundings; and two parallel wires within certain spacing will be treated as one fat wire. This halation effect results in jogs in wiring and thus inevitably creates congestion.

In addition to the RET or lithography technologies, metal density control further contributes to the complexity of the global routing algorithm. If the global router can accommodate the metal density control rules the overall design may thus produce better estimates of parasitics.

One existing approach is to handle the issue of how to determining whether to use hard rules or soft rules during detailed routing only. This approach involves, however, laborious and often manual efforts and lacks accuracy in terms of design rule marking which inevitably causes wastes of computational resource at the routing stage. That is, some elements of human strategy and scrutiny must be applied to examine the detailed routing violations to mark the region rule. Another drawback of this approach is that adequate routing space is not reserved early in the routing process, and thus opportunities to apply the preferred rule may be lost as a result.

Another existing approach is to proceed through detailed routing and then mark certain regions as "use hard rule" based on detail routing violations. These regions are marked using a spacing checker. This drawback of this latter approach is, again, the inevitable waste of computational resource as it proceeds through the detailed routing before each region is appropriately marked. Also, the spacing checker takes time and may mark routing violations that could have been avoided if the router attempted to adhere to the preferred rule. In addition, another issue which negatively impacts the applicability of this latter approach is that most routers do not honor such a region rule.

As such, there exists a need for a method and system to determine, during global routing and before detailed routing, when to use a hard rule and when to use a preferred rule when both the hard and soft rules are present in the integrated circuit design. Various embodiments of the present invention addresses this issue.

BRIEF DESCRIPTION OF THE FIGURES

The accompanying drawings are included to provide a further understanding of various embodiments of the invention and, together with the Detailed Description, serve to explain the principles of various embodiments of the invention.

DETAILED DESCRIPTION

In one embodiment, the present invention considers hard and soft rules simultaneously earlier in the routing process, so it is more likely to allocate room to obey the preferred rule. The global router can reserve additional space so that the detailed router will have enough room to apply the preferred rule. If the global router was not involved, local congestion could block the use of the preferred rule. Since various embodiments of the invention apply earlier in the routing process, applying various embodiments of the present invention gives a faster turn-around-time than proceeding through detailed router. Throughout the process, an integrated circuit design that is determined to be "routable" stays "routable" in the global routing sense. Using marking after detail routing, there is no guarantee that the resulting design is "routable" because it starts from scratch.

For the ease of explanation, it may be supposed that the integrated circuit design is routable. In one embodiment, the invention is to weaken the design rules and re-mark the g-cell grid according to the preferred rule. Using the preferred rule means that the routing demand will either stay the same or increase. If the g-cell is overcongested according to the preferred rule, then mark the g-cell as using the hard rule. Otherwise mark the g-cell as using the preferred rule. If the chip is re-marked locally using the rule indicated by the g-cell, then the design remains routable. Other routing processes can use g-cell marks to determine what rule should be applied. The global router can also use these marks as a better starting point for subsequent passes.

More specifically, various embodiments of the present invention apply to global routing of a chip when both hard rules and preferred rules are present. More precisely, various embodiments of the present invention provide a method and system to determine when to use a hard rule and when to use a preferred or soft rule during global routing. The method or the system is first to route with the hard rule to ensure that the design can be embedded. The design is then analyzed with the preferred rule to determine the degree of congestion based in part on the routing demand, routing capacity, and blockage. An area is deemed to be overcongested if its routing demand together with blockage within the area exceed its routing capacity. Overcongested areas are then marked as "use hard rule", while non-overcongested regions are marked as "use preferred rule." This method ensures that the design remains routable throughout the entire process, and significant areas can be reserved for the preferred rules.

Figure 1:
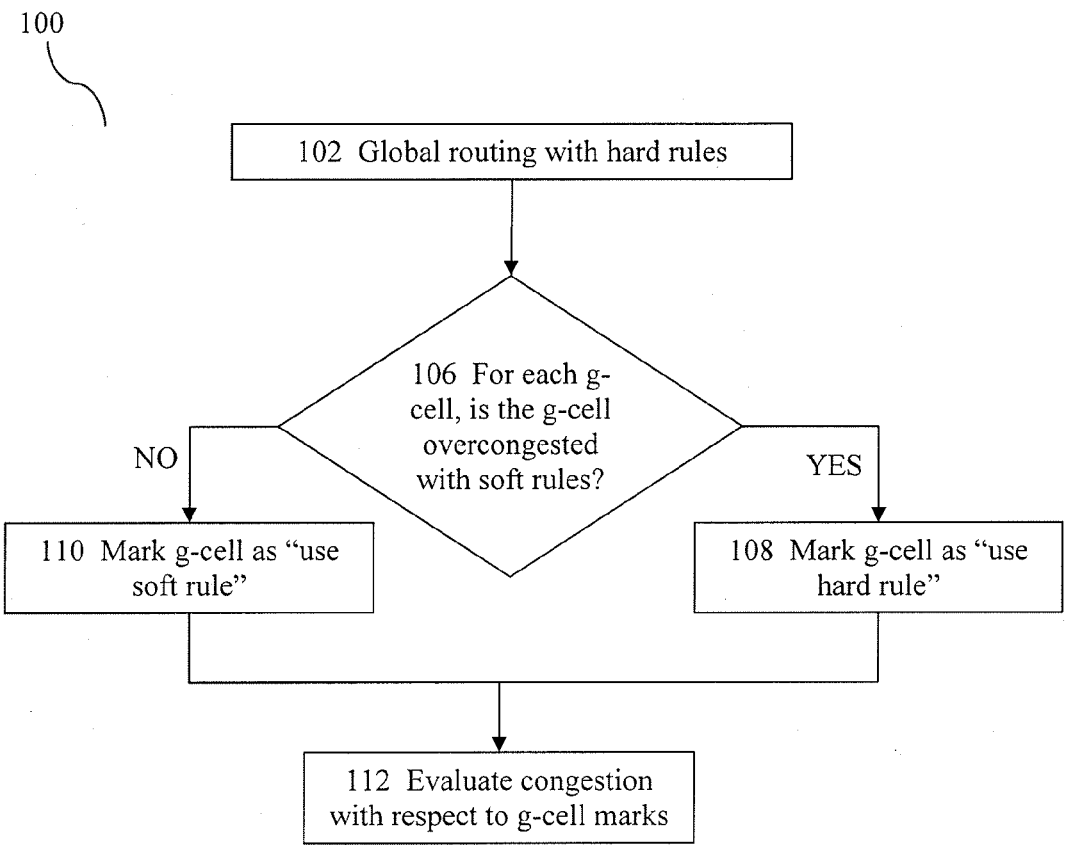
FIG. 1 illustrates an embodiment of the present invention of a method and system for marking the g-cells with the appropriate design rules when both the hard rules and the preferred rules are present in the integrated circuit design.

Referring to FIG. 1 which illustrates an embodiment of the present invention of a method 100 for marking the g-cells with the appropriate design rules when both the hard rules and the preferred rules are present in the integrated circuit design. At action 102, all g-cells are marked with "use hard rule" and global routing in accordance with the markings is performed. It is noted that routing first with hard rules may ensure the routability of the integrated circuit design if the integrated circuit design is routable in the first place. At 106, the method or the system then recursively examines and determines, for each g-cell in the g-cell grid, whether a g-cell is overcongested under the soft rule. Where a particular g-cell is determined to be not overcongested under the soft rule, this particular g-cell is then marked as "use soft rule" at 110. On the other hand, where a particular g-cell is determined to be overcongested under the soft rules, this particular g-cell is marked as "use hard rules" at 108. Then the method or the system proceeds to evaluate congestion with respect to the g-cell marks at 112. It is also noted that marking g-cells as "use hard rule" or "use soft rule" may be accomplished with using a one-bit data field where the value of one represents "use hard rule" and the value of zero represents "use soft rule" or vice versa. Nonetheless, marking the g-cells may also be accomplished with other means or lengths of data field to achieve the same purpose.

According to the method and the system described in FIG. 1, adequate routing space is reserved early during the global routing process, and thus opportunities to apply the preferred rule may be preserved as a result.

Figure 2:
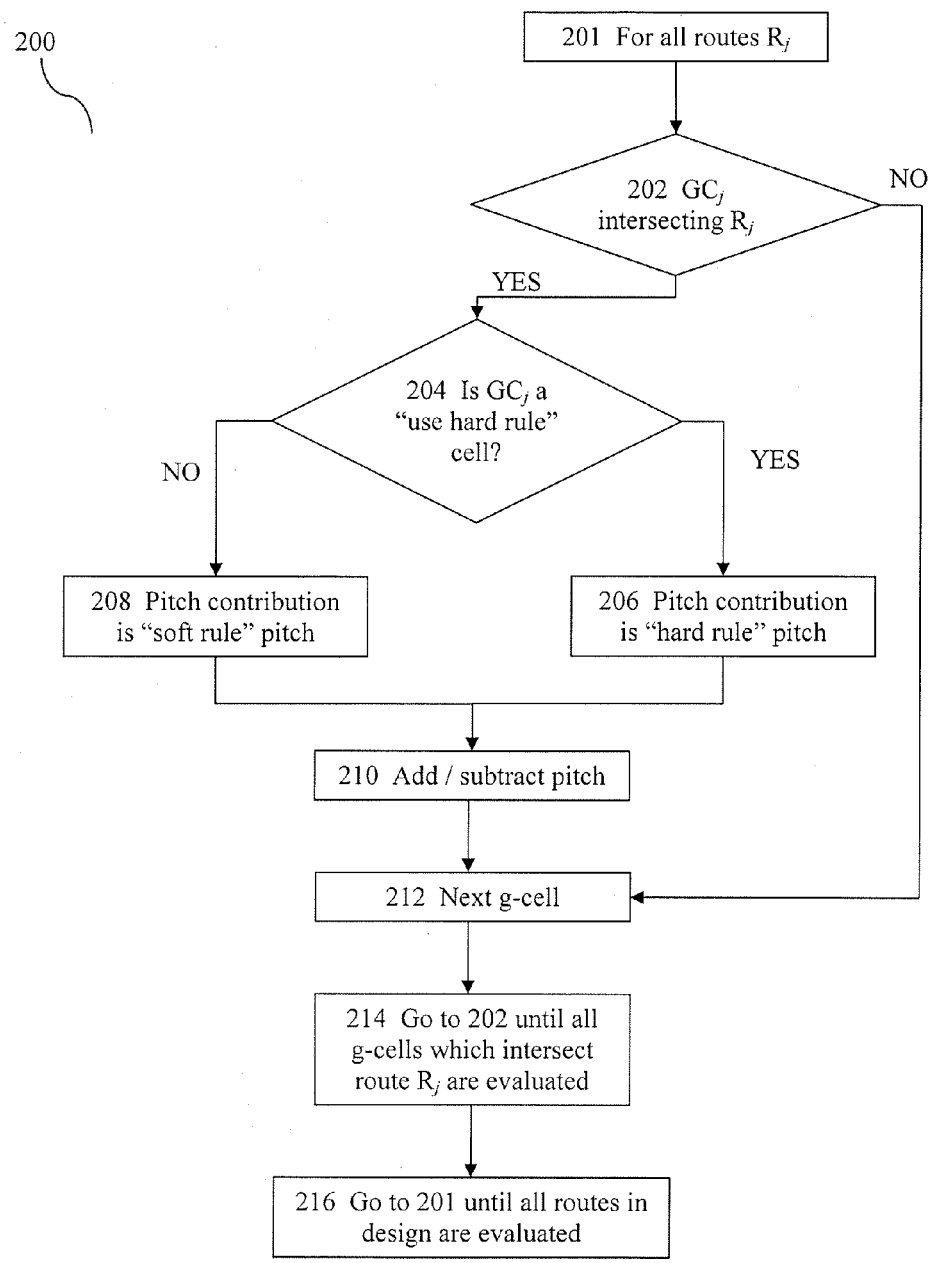
FIG. 2 illustrates an embodiment of the present invention of a method and system for evaluating the congestion of the g-cells by determining the routing demand based on whether hard rules or preferred rules apply to the g-cells.

Referring to FIG. 2 which illustrates an embodiment of the present invention of a method 200 for evaluating the congestion of the g-cells by determining the routing demand based on whether hard rules or preferred rules apply to the g-cells. At 201, the method or the system first identifies all routes $R_j$ in the routing area. At 202, the method or the system then examines each route against each g-cell, $GC_j$, to determine whether a particular route intersects a particular g-cell, $GC_j$. Where the particular route does not intersect $GC_j$ under consideration, the method or the system proceeds to 212 to select the next g-cell and then to 214 to loop back to 202 until all g-cells $GC_j$ which intersect route $R_j$ are evaluated. Where the particular route intersects the selected g-cell, $GC_j$, the method or the system proceeds to 204 to determine whether $GC_j$ is marked as "use hard rule". Where $GC_j$ is marked as "use hard rule", the method or the system proceeds to 206 where the hard rule pitch is used to determine how much demand the particular route uses in $GC_j$. On the other hand, where $GC_j$ is marked as "use soft rule" or is not marked as "use hard rule", the method or the system then proceeds to 206 where the soft rule pitch is used to determine how much demand the particular route uses in $GC_j$. After 206 and 208, the method or the system then proceeds to 210 to add or subtract pitch according to the previously determined hard rule pitch at 206 or soft rule pitch at 208. The method or the system then selects the next g-cell, $GC_j$, for similar processing with respect to the selected route $R_j$ at 212. The actions from 202 to 212 is repeated until the routing demand for each g-cell $GC_j$ is properly determined according to the pitch determined above in 206 and 208. Finally, at 216, the method or the system goes back to 201 to select the next route $R_j$ and repeats actions 202 to 214 until all routes $R_j$ have been similarly evaluated with respect to all the g-cells, $GC_j$.

A integrated circuit may be modeled with a hypergraph G(C,N), where C is a set of cells and N is a set of nets. A net e∈N is a subset of C that contains two or more cells. A placement is a set of locations for all cells within a rectangular chip area. During detailed placement and global routing, the core area is divided into m×n rectangular global bins. For standard-cell designs, n is set to be the number of standard-cell rows, and m is set so that the average number of cells per global bin is less than, a threshold such as 5. The boundaries of the global bins are global bin edges. For each global g-cell, the routing demand d is the number of wires that cross the boundaries of the global g-cell; the routing capacity c is determined by taking the number of wires that are allowed to cross the routing boundaries of the g-cell and the blockage within the g-cell into consideration. In determining the routing capacity c due to the presence of the wires, the pitch must first be determined according to the design rules.

A pitch of the $i^{th}$ routing layer is generally defined to be $g_i=w_i+s_i$, where $w_i$ denotes the width of the wire under certain design rules, and $s_i$ denotes the spacing between two adjacent wires. For example a typical hard rule may dictate that each wire is to take one track, while a typical soft rule allows for two tracks for each wire. This is because the hard spacing rules may allow narrower spacing between two adjacent wires, while the soft spacing rules may require wider spacing between two adjacent wires Once the routing demand and routing capacity of a particular g-cell are determined, the congestion of the g-cell may thus be determined by comparing the routing demand against the routing capacity of this particular g-cell.

Figure 3:
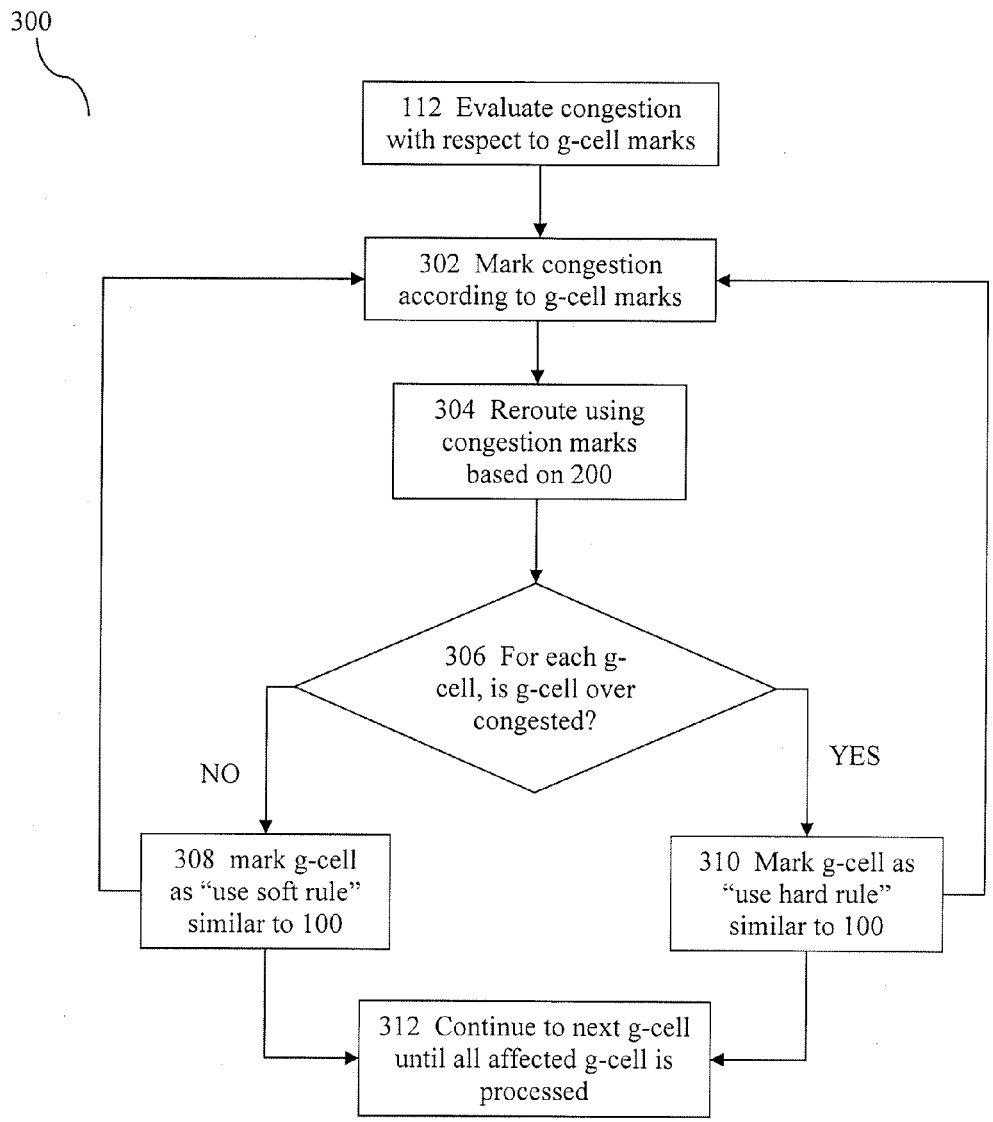
FIG. 3 illustrates an embodiment of the present invention of a method and system for marking of the g-cells with the appropriate design rules is applied to incremental changes in integrated circuit designs.

Referring to FIG. 3 which illustrates an embodiment of the present invention of a method 300 for marking of the g-cells with the appropriate design rules is applied to incremental changes in integrated circuit designs. The method or the system starts from 112 of FIG. 1 where congestion is evaluated with respect to the g-cell marks. The method or the system then proceeds to 302 to mark, according to the g-cell marks, congestion of each g-cell which may be affected by the incremental changes sought to be implemented at 302. At 304, the method or the system performs to reroute the integrated circuit design in the g-cells which may be affected by the incremental changes. Then at 306, the method or the system determines, for each g-cell that may be affected by the incremental changes, whether a particular g-cell is overcongested under the soft design rules. At 308, where the particular g-cell is not overcongested under the soft design rules, this particular g-cell is then marked as "use soft rule" in a manner similar to that described in FIG. 1. On the other hand, at 310, where this particular g-cell is determined to be overcongested at 306, this particular g-cell is then marked as "use hard rule" in a manner similar to that described in FIG. 1. Then the method or the system proceeds to 312 and continue to the next g-cell which may be affected by the incremental changes until all g-cells which may be affected by the incremental changes are similarly processed.

One of the applications for the method or the system as described in FIG. 3 is to capture incremental changes such as engineering change orders (ECOs) in the integrated circuit design without having to re-perform global routing of the entire design. This approach greatly saves valuable time and computational resources while ensuring adequate routable space is reserved early in the design process.

Figure 4:
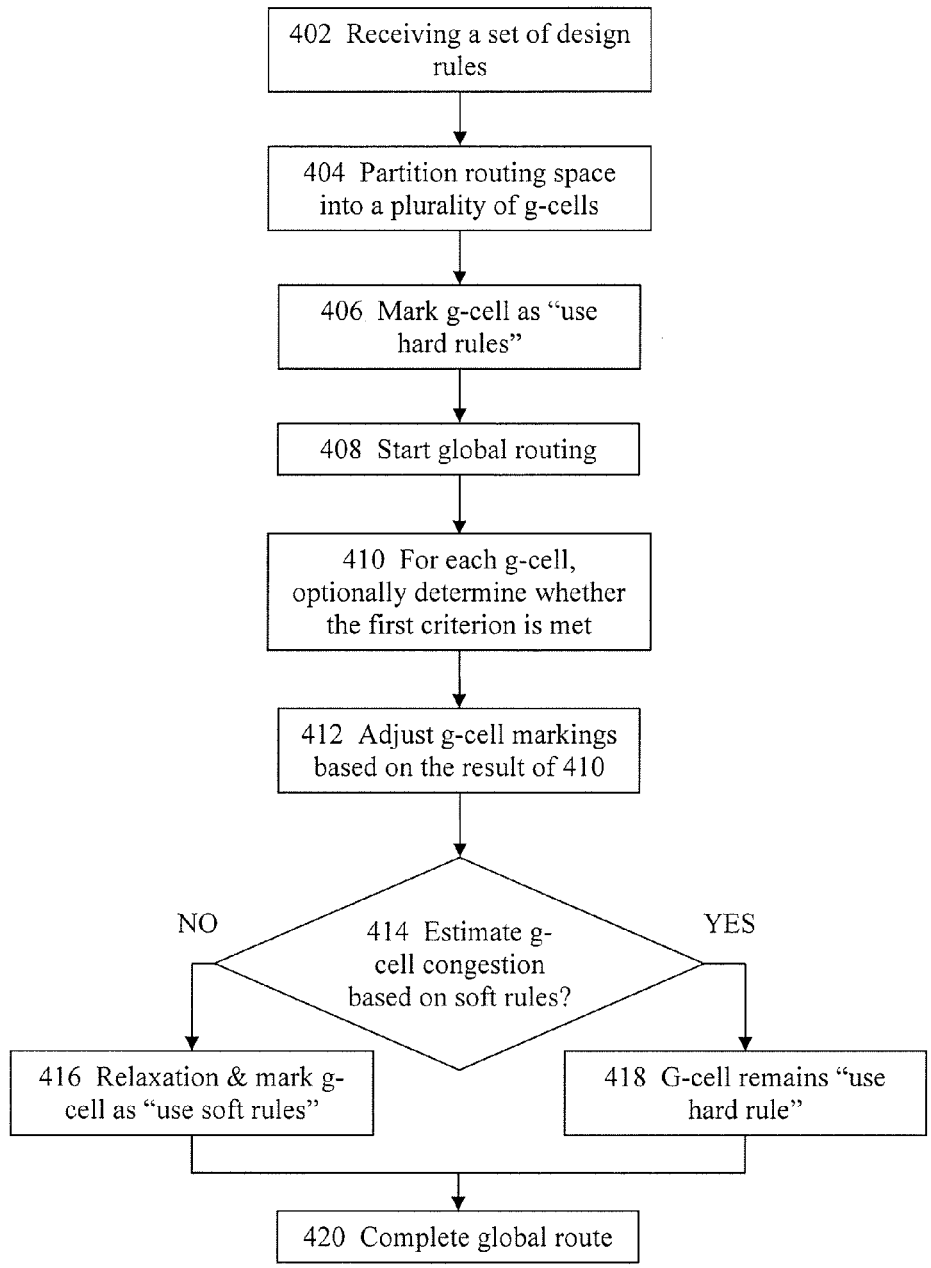
FIG. 4 illustrates an embodiment of the present invention of a method and system for marking the g-cells with the appropriate design rules while taking additional criteria into consideration

Referring to FIG. 4 which illustrates an embodiment of the present invention of a method and system for marking the g-cells with the appropriate design rules while taking additional criteria into consideration. Such additional criteria may comprise, for example, metal density control rules. One of the advantages for a global router to take these additional criteria is that the overall design is of better quality. For instance, the overall design produces better estimate of parasitics if the global router is designed so as to be able to take the metal density control rules into consideration during global routing. The method or the system first starts at 402 to receive a set of design rules including both the hard rules and the preferred rules. At 404, the method or the system then partitions the routing space into a plurality of g-cells and forms the g-cell grid. The method or the system proceeds to mark all g-cells in the g-cell grid as "use hard rules" at 406 and then performs global routing at 408. At 410, the method or the system then proceeds to account for additional design criteria and determine whether one or more of these additional design criteria are satisfied.

After these additional design criteria are accounted for at 410, the method or the system proceeds to 412 to adjust, in accordance with the result of action 410, g-cell markings that were previously performed at 406. At 414, the method or the system then estimates or evaluates g-cell congestion based on the preferred rules. The congestion is estimated or evaluated based on similar methods as described in FIGS. 1 and 2. At 416, where a particular g-cell is not overcongested under the preferred rules, this particular g-cell is then marked as "use soft rule" in a manner similar to that described in FIG. 1. On the other hand, at 418, where a particular g-cell is determined to be overcongested, this particular g-cell is then marked as "use hard rule" in a manner similar to that described in FIG. 1. The method or the system then repeats the actions 410-418 until all the g-cells are properly marked to accommodate both the design rules and the additional criteria. Then the method or the system proceeds to 420 to complete global routing.

It is noted that such additional criteria comprise design density control, lithography rules such as the OPC line end correction rules and concave and convex corner correction rules, the PSM rules, and OAI rules, whether one or more routes are on critical paths, or whether some of the dimensions constitutes critical dimensions. For example, in one embodiment, the method or the system may determine whether additional space should be reserved at the global routing stage where additional lithography rules are present and accounted for.

Figure 5:
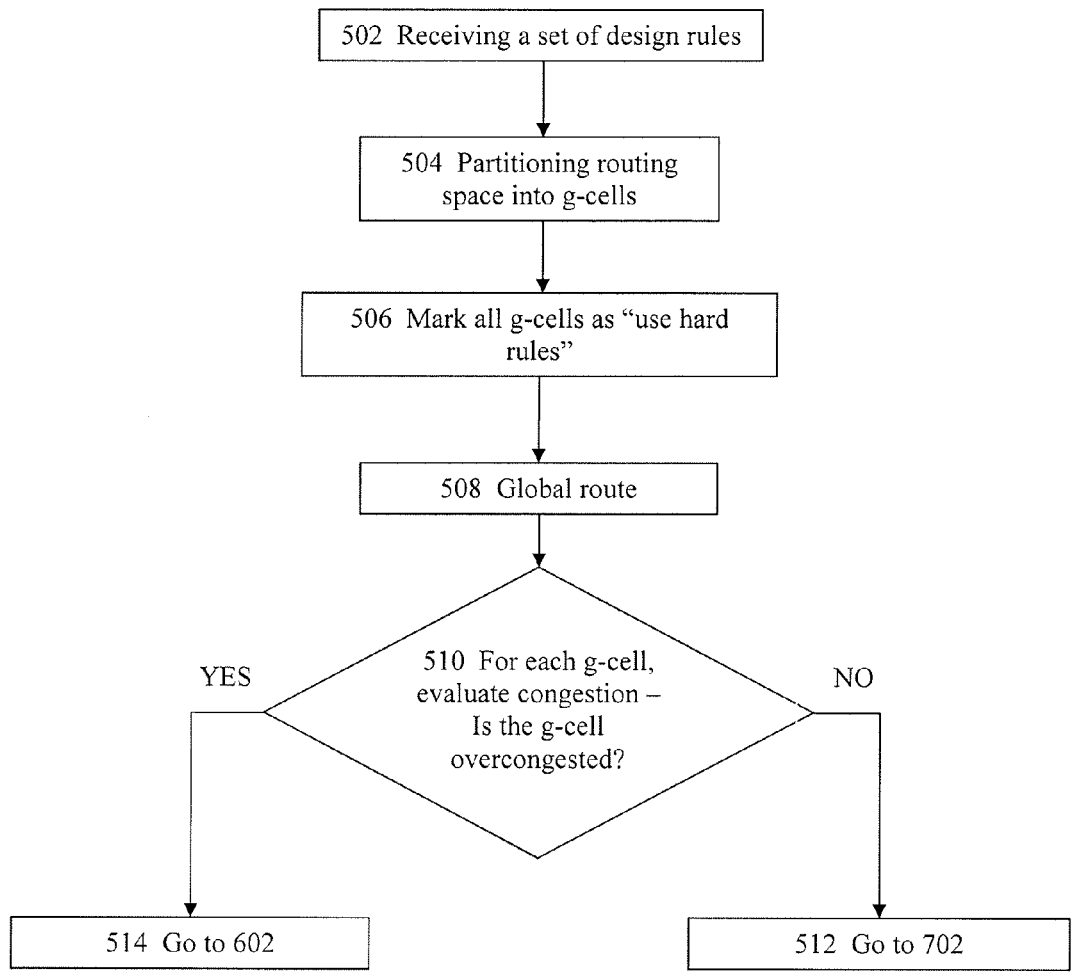
FIG. 5 illustrates an embodiment of the present invention of a method and system for determining whether hard rules or preferred rules should apply to the g-cells in a multi-level coarsening and un-coarsening approach.

Referring to FIG. 5 which illustrates an embodiment of the present invention of a method and system for determining whether to mark g-cells as "use hard rules" or "use preferred rules" in a multi-level coarsening and un-coarsening approach. At 502, the method or the system first receives a set of design rules including both the hard rules and the preferred rules. At 504, the method or the system partitions the routing space into g-cells and forms the g-cell grid. The method or the system then proceeds to mark all g-cells as "use hard rules" at 506. At 508, global routing is performed in accordance with the g-cell markings. Then the method or the system proceeds to 510 to evaluate or estimate g-cell congestion for each g-cell under the soft rules based upon a similar method as described in FIG. 2 and its corresponding text and to determine whether a particular g-cell is overcongested. Where the particular g-cell is overcongested, the method or the system proceeds to 602 which will be described in further details below. Where the particular g-cell is not overcongested, the method or the system proceeds to 702 which will also be described and discussed in further details below.

Figure 6:
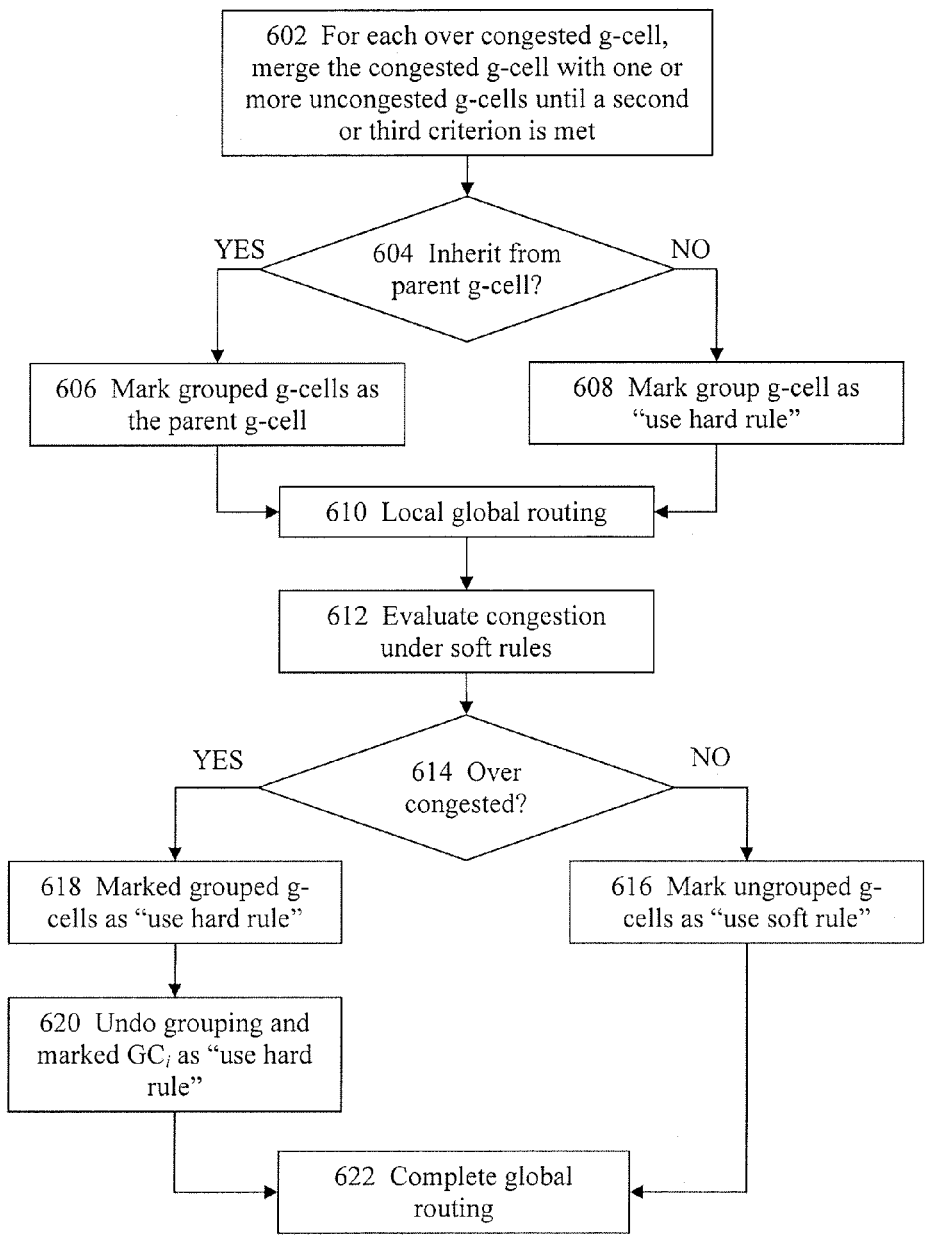
FIG. 6 illustrates an embodiment of the present invention of a method and system for determining whether hard rules or preferred rules should apply to the over congested g-cells in a multi-level coarsening and un-coarsening approach.

Referring to FIG. 6 which illustrates an embodiment defining a method for determining whether a hard rule or a preferred rule should be used for a particular g-cell, $GC_i$, after this particular $GC_i$ is determined to be overcongested under the soft rules after the initial marking. The method or the system starts at 514 of FIG. 5. At 602, the method or the system identifies, for each overcongested $GC_i$, one or more uncongested g-cells adjacent to the congested $GC_i$ and groups the congested $GC_i$ with one or more of the identified uncongested g-cells to form $GC^c_i$, where the superscript c and subscript i indicate this particular GC is grouped or coarsened due to the overcongested g-cell $GC_i$. If, on the other hand, all the adjacent g-cells of this particular congested $GC_i$ are also congested, the method or the system may look further to identify additional uncongested g-cells. The method or the system may then determine how far to look to identify uncongested g-cells around $GC_i$ and whether it is practical to proceed to group $GC_i$ together with its adjacent overcongested g-cells with these uncongested g-cells based on one or more criteria. If it is determined that it is practical to group $GC_i$ together with its adjacent overcongested g-cells with one or more uncongested g-cells, the method or the system may then group all the above g-cells together to form another coarsened g-cell. For the purpose of explanation and simplicity, the particular overcongested $GC_i$ in question may be assumed to be adjacent to one or more uncongested g-cells. It is noted, however, that various embodiments of the present invention should not be limited as such.

At 604, the method or the system determines whether the grouped g-cell, $GC^c_i$, inherits the g-cell marking from its parent g-cell, $GC_i$. Alternatively, the designer may specify that all grouped g-cells, $GC^c_i$, are to inherit their respective g-cell marking from their respective parent g-cells, $GC_i$. Where it is determined or specified that the grouped g-cell, $GC^c_i$, is to inherit its g-cell marking from its parent g-cell, $GC_i$, the grouped g-cell, $GC^c_i$, is marked in the same manner as the parent g-cell, $GC_i$ at 606. On the other hand, if it is determined or specified that the grouped g-cell, $GC^c_i$, is not to inherit its g-cell marking from its parent g-cell, $GC_i$, the grouped g-cell, $GC^c_i$, is then first marked as "use hard rule" at 608. Whether the grouped g-cell, $GC^c_i$, inherits its design rule marking from its parent g-cell, $GC_i$, the method or the system then proceeds to 610. At 610, the method or the system then perform local global routing among the g-cells affected by the grouping (or coarsening) of g-cells. Alternatively, the method or the system may perform global routing over the entire integrated circuit design.

At 612, the method or the system then evaluates congestion of g-cells affected by the grouping (or coarsening) and global routing actions under the soft rules in a similar manner as described in FIG. 2. At 614, the method or the system then proceeds to determine whether the g-cells affected by the grouping (or coarsening), including $GC^c_i$, are overcongested under the soft rules in a similar manner as described in FIG. 2. At 616, where the g-cells affected by the grouping (or coarsening) are determined to be overcongested, such g-cells are marked as "use hard rule." At 618, where the g-cells affected by the grouping (or coarsening) are determined not to be congested, such g-cells are marked as "use soft rule." Alternatively, where the g-cells affected by the grouping (or coarsening) are determined not to be congested, the method or the system may undo the grouping (or coarsening) and mark $GC_i$ as "use hard rule" while the markings of the other g-cells remain unchanged. Once all g-cells affected by the grouping (or coarsening), the method or the system proceeds to complete global routing at 622.

Figure 7:
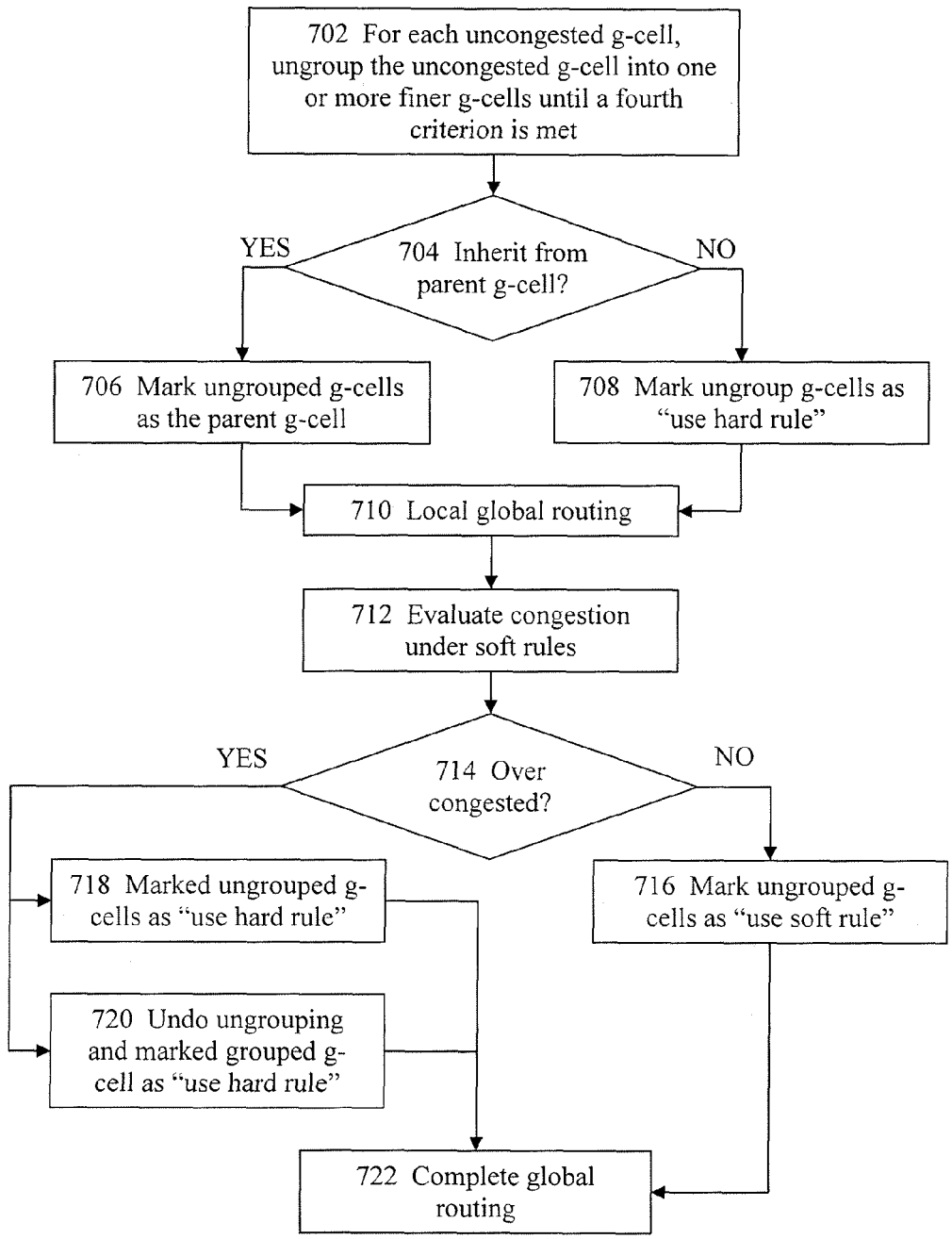
FIG. 7 depicts an embodiment of the present invention of a method and system for determining whether hard rules or preferred rules apply to the g-cells which are not over congested in a multi-level coarsening and un-coarsening approach.

Referring to FIG. 7 which illustrates an embodiment defining a method for determining whether a hard rule or a preferred rule should be used for a particular g-cell, $GC_j$, after this particular $GC_j$ is determined not to be overcongested under the soft rules after the initial marking. The method or the system starts at 512 of FIG. 5. At 702, the method or the system ungroups (or uncoarsens) the uncongested $GC_j$, into one or more finer g-cells $GC^u_j$, where the superscript u and subscript j indicate these particular g-cells $GC^u_j$ are derived from the uncongested g-cell $GC_j$ by uncoarsening.

At 704, the method or the system determines whether the finer g-cells $GC^u_j$ inherit the g-cell marking from its parent g-cell, $GC_j$. Alternatively, the designer may specify that all ungrouped (or uncoarsened) g-cells, $GC^u_j$, are to inherit the parent g-cell marking from their parent g-cell, $GC_j$. Where it is determined or specified that the uncoarsened g-cells, $GC^u_j$, are to inherit their g-cell markings from their parent g-cell, $GC_j$, the uncoarsened g-cells, $GC^u_j$, are marked in the same manner as the parent g-cell, $GC_j$ at 706. On the other hand, if it is determined or specified that the uncoarsened g-cells, $GC^u_j$, are not to inherit their g-cell markings from their parent g-cell, $GC_j$, the uncoarsened g-cells, $GC^u_j$, are then first marked as "use hard rule" at 708. Whether the uncoarsened g-cells, $GC^u_j$, inherit their design rule markings from their parent g-cell, $GC_j$, the method or the system then proceeds to 710. At 710, the method or the system then perform local global routing among the g-cells affected by the grouping (or coarsening) of g-cells. Alternatively, the method or the system may perform global routing over the entire integrated circuit design.

At 712, the method or the system then evaluates, under the soft rules, congestion of these uncoarsened g-cells affected by the ungrouping (or uncoarsening) and global routing actions in a similar manner as described in FIG. 2. At 714, the method or the system then proceeds to determine, under the soft rules, whether the g-cells affected by the ungrouping (or uncoarsening) action, including $GC^u_j$ are overcongested in a similar manner as described in FIG. 2. At 716, where the g-cells affected by the ungrouping (or uncoarsening) are determined not to be overcongested, such g-cells are marked as "use soft rule." At 718, where the g-cells affected by the ungrouping (or uncoarsening) are determined to be congested, such g-cells are marked as "use hard rule." Alternatively, where the g-cells affected by the ungrouping (or uncoarsening) are determined to be congested, the method or the system may undo the ungrouping (or uncoarsening) and mark $GC_j$ as "use hard rule" while the markings of the other g-cells remain unchanged. Once all g-cells affected by the ungrouping (or uncoarsening), the method or the system proceeds to complete global routing at 722.

System Architecture Overview

In the following description, numerous details are set forth for purpose of explanation. However, one of ordinary skill in the art will realize that various embodiments of the invention may be practiced without the use of these specific details. In other instances, well-known structures and devices are shown in block diagram form in order not to obscure the description of various embodiments of the invention with unnecessary detail.

Figure 8:
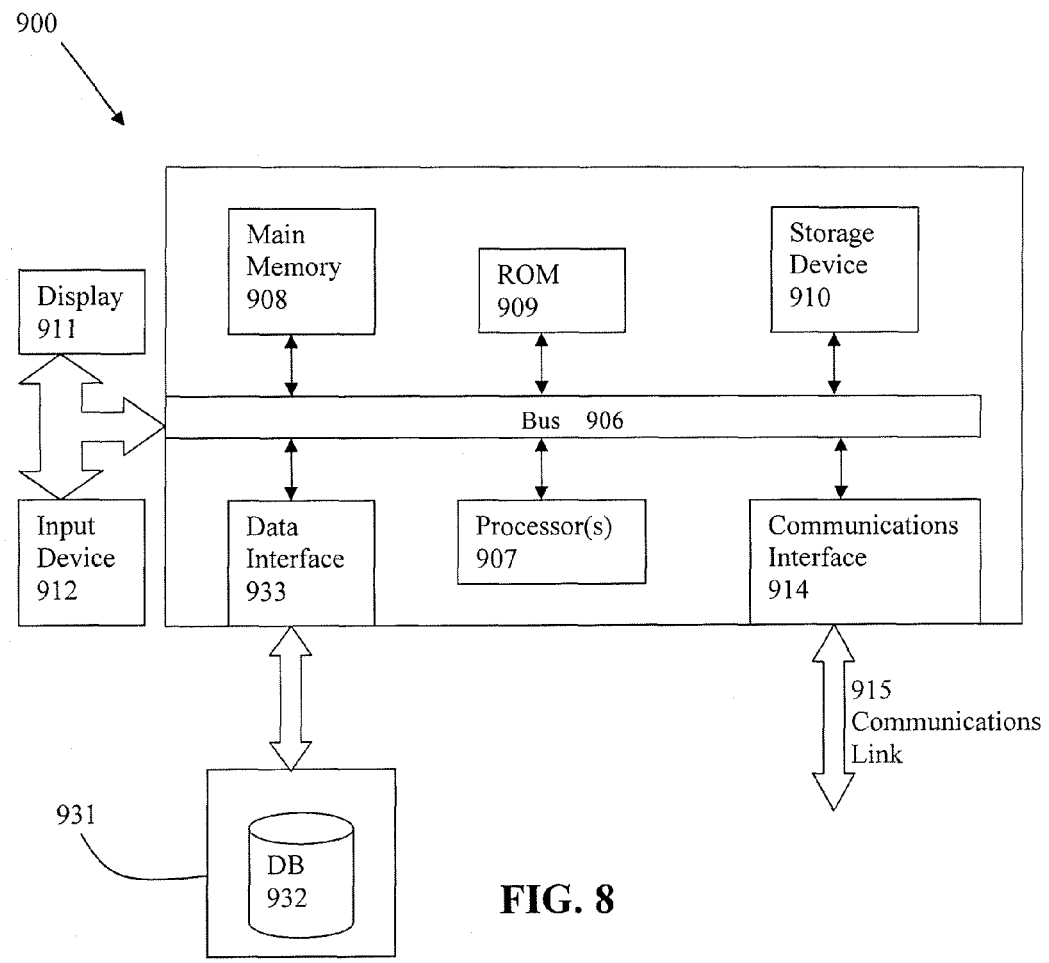
FIG. 8 depicts a computerized system on which a method for timing closure with concurrent process models can be implemented.

FIG. 8 is a block diagram of an illustrative computing system 900 suitable for implementing an embodiment of the present invention for determining, during global routing, when to use hard rules and when to use the preferred rules for the g-cells in the g-cell grid when both the hard rules and the preferred rules are present in the integrated circuit design. Computer system 900 includes a bus 906 or other communication mechanism for communicating information, which interconnects subsystems and devices, such as processor 904, system memory 908 (e.g., RAM), static storage device 909 (e.g., ROM), disk drive 910 (e.g., magnetic or optical), communication interface 914 (e.g., modem or ethernet card), display 911 (e.g., CRT or LCD), input device 912 (e.g., keyboard), and cursor control (e.g., mouse or trackball. Not shown).

According to one embodiment of the invention, computer system 900 performs specific operations by processor 907 executing one or more sequences of one or more instructions contained in system memory 908. Such instructions may be read into system memory 908 from another computer readable/usable medium, such as static storage device 909 or disk drive 910. In alternative embodiments, hard-wired circuitry may be used in place of or in combination with software instructions to implement various embodiments of the invention.

The term "computer readable medium" or "computer usable medium" as used herein refers to any medium that participates in providing instructions to processor 907 for execution. Such a medium may take many forms, including but not limited to, non-volatile media and volatile media. Non-volatile media includes, for example, optical or magnetic disks, such as disk drive 910. Volatile media includes dynamic memory, such as system memory 908.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice various embodiments of the invention is performed by a single computer system 900. According to other embodiments of the invention, two or more computer systems 900 coupled by communication link 915 (e.g., LAN, PTSN, or wireless network) may perform the sequence of instructions required to practice various embodiments of the invention in coordination with one another.

Computer system 900 may transmit and receive messages, data, and instructions, including program, i.e., application code, through communication link 915 and communication interface 914. Received program code may be executed by processor 907 as it is received, and/or stored in disk drive 910, or other non-volatile storage for later execution.

In the foregoing specification, various embodiments of the invention have been described with reference to specific embodiments thereof. It will, however, be evident that various modifications and changes may be made thereto without departing from the broader spirit and scope of various embodiments of the invention. For example, the above-described process flows are described with reference to a particular ordering of process actions. However, the ordering of many of the described process actions may be changed without affecting the scope or operation of various embodiments of the invention. The specification and drawings are, accordingly, to be regarded in an illustrative rather than restrictive sense.

What is claimed is:

1. A computer-implemented method for determining whether to use hard rules or whether to use soft rules for a first g-cell during global routing of an integrated circuit design, comprising:
performing global routing with one or more of the hard rules which comprise a first requirement for a routing demand and guide the global routing;
determining, by using at least one processor, whether a first g-cell in the global routing is overcongested by at least using one or more of the soft rules, wherein
the one or more of the soft rules comprise a second requirement for the routing demand and are not the hard rules;
identifying or creating a marking of the first g-cell as using soft rule to improve at least a performance aspect of the integrated circuit design by using at least some of the soft rules where the first g-cell is determined not to be overcongested in the act of determining whether the first g-cell is overcongested, wherein
the marking of the first g-cell indicates what rule the first g-cell is to be based at least in part upon during a routing of the integrated circuit design; and
storing a result of the act of identifying the marking of the first g-cell in a tangible computer accessible medium for use in subsequent routing or displaying the result on a display apparatus.

2. The computer-implemented method of claim 1, in which the action of determining whether the first g-cell is overcongested comprises:
identifying a route in the first g-cell;
identifying whether the marking of the first g-cell is using hard rule or using soft rule;
determining the pitch contribution to the first g-cell based at least in part upon the marking of the first g-cell; and
adjusting the pitch in the first g-cell according to the pitch contribution.

3. The computer-implemented method of claim 2, in which the act of adjusting the pitch comprises adding or subtracting the pitch based at least in part upon the pitch contribution.

4. The computer-implemented method of claim 2, in which the pitch contribution is a hard rule pitch where the marking of the first g-cell is using hard rule.

5. The computer-implemented method of claim 2, in which the pitch contribution is a soft rule pitch where the marking of the first g-cell is using soft rule.

6. The computer-implemented method of claim 1, further comprising:
reevaluating congestion of the first g-cell after marking the g-cell as using soft rule.

7. The computer-implemented method of claim 6, further comprising:
marking the congestion based at least in part upon a result of the action of reevaluating the congestion;
rerouting a route in a second g-cell in accordance with a result of the marking congestion action;
determining whether the second g-cell is overcongested; and
marking the second g-cell as using soft rule, in which the second g-cell is determined not to be overcongested.

8. The computer-implemented method of claim 1, further comprising:
determining whether a first criterion is met for the integrated circuit design.

9. The computer-implemented method of claim 8, in which the first criterion comprises a design density control criterion.

10. The computer-implemented method of claim 8, in which the first criterion comprises whether the route is on a critical path.

11. The computer-implemented method of claim 8, in which the first criterion comprises whether a critical dimension is involved.

12. The computer-implemented method of claim 1, further comprising:
merging the first g-cell determined to be overcongested with a third g-cell until a second criterion is met to form a fourth g-cell, in which the third g-cell is adjacent to the first g-cell.

13. The computer-implemented method of claim 12, in which the third g-cell is determined not to be overcongested.

14. The computer-implemented method of claim 12, further comprising:
merging the first g-cell determined to be overcongested with a fifth g-cell until a third criterion is met to form a sixth g-cell, in which the third g-cell is determined to be overcongested and the fourth g-cell is determined not to be overcongested.

15. The computer-implemented method of claim 14, in which the third criterion comprises a second predefined cost metric for routing.

16. The computer-implemented method of claim 14, in which the third criterion comprises a first minimum threshold number of components within the fifth g-cell to be considered during global routing.

17. The computer-implemented method of claim 14, in which the third criterion comprises a second maximum threshold number of g-cells in the integrated circuit design.

18. The computer-implemented method of claim 12, further comprising:
determining whether the fourth g-cell inherits the marking from the first g-cell;
identifying a marking of design rule for the fourth g-cell;
performing the global routing in the fourth g-cell;
evaluating congestion of the fourth g-cell based at least in part on a second corresponding soft rule; and
determining whether the fourth g-cell is overcongested based at least in part upon a result of the action of evaluating the congestion of the fourth g-cell based at least in part on the second corresponding soft rule.

19. The computer-implemented method of claim 18, in which the marking for the fourth g-cell is using hard rule, where the fourth g-cell does not inherit marking of design rule from the first g-cell.

20. The computer-implemented method of claim 18, in which the marking of design rule for the fourth g-cell is identical to the marking of the first g-cell, where the fourth g-cell inherits marking of design rule from the first g-cell.

21. The computer-implemented method of claim 18, further comprising:
undoing the action of merging the first g-cell with a third g-cell, in which the fourth g-cell is determined to be overcongested.

22. The computer-implemented method of claim 18, further comprising:
marking the fourth g-cell as using hard rule, in which the fourth g-cell is determined to be overcongested under the second corresponding soft rule.

23. The computer-implemented method of claim 18, further comprising:
marking the fourth g-cell as using soft rule, in which the fourth g-cell is determined not to be overcongested under the second corresponding soft rule.

24. The computer-implemented method of claim 12, in which the second criterion comprises a first predefined cost metric for routing.

25. The computer-implemented method of claim 12, in which the second criterion comprises a first maximum threshold number of components within the fourth g-cell to be considered during global routing.

26. The computer-implemented method of claim 12, in which the second criterion comprises a second maximum threshold number of g-cells in the integrated circuit design.

27. The computer-implemented method of claim 1, in which the action of determining congestion comprises:
   determining a routing demand of the first g-cell;
   determining a routing capacity of the first g-cell; and
   identifying the first g-cell as overcongested based at least in part upon the routing demand and the routing capacity.

28. The computer-implemented method of claim 1, further comprising:
   uncoarsening the first g-cell determined not to be overcongested until a fourth criterion is met to form a set of g-cells comprising a seventh g-cell.

29. The computer-implemented method of claim 28, in which the seventh g-cell is identical to the first g-cell.

30. The computer-implemented method of claim 28, further comprising:
   determining whether the seventh g-cell inherits a marking of design rule from the first g-cell;
   identifying a marking of design rule for the seventh g-cell;
   performing global routing in at least the seventh g-cell;
   evaluating congestion of the seventh g-cell under a third corresponding soft rule; and
   determining, under the third corresponding soft rule, whether the seventh g-cell is overcongested based at least in part upon the congestion of the seventh g-cell.

31. The computer-implemented method of claim 30, in which the marking for the seventh g-cell is using hard rule, where the seventh g-cell does not inherit marking of design rule from the first g-cell.

32. The computer-implemented method of claim 30, in which the marking for the fourth g-cell is identical to the marking for the first g-cell, where the seventh g-cell inherits marking of design rule from the first g-cell.

33. The computer-implemented method of claim 30, further comprising:
   undoing the action of uncoarsening the first g-cell, in which the seventh g-cell is determined to be overcongested.

34. The computer-implemented method of claim 30, further comprising:
   marking the seventh g-cell as using hard rule, in which the seventh g-cell is determined to be overcongested under the third corresponding soft rule.

35. The computer-implemented method of claim 30, further comprising:
   marking the fourth g-cell as using soft rule, in which the seventh g-cell is determined not to be overcongested under the third corresponding soft rule.

36. The computer-implemented method of claim 28, in which the fourth criterion comprises a predefined uncoarsening scheme.

37. The computer-implemented method of claim 28, in which the fourth criterion comprises a minimum threshold number of g-cells in the set of g-cells.

38. The computer-implemented method of claim 28, in which the fourth criterion comprises a result of congestion evaluation of the set of g-cells.

39. A system for determining whether to use the hard rules or whether to use the preferred rules for a first g-cell during global routing of an integrated circuit design, comprising:
   at least one processor configured for:
      performing global routing with one or more hard rules which comprise a first requirement for a routing demand and guide the global routing;
      determining whether a first g-cell in the global routing is overcongested by at least using one or more of the soft rules, wherein the one or more of the soft rules comprise a second requirement for the routing demand and are not the hard rules; and
      identifying or creating a marking of the first g-cell as using soft rule to improve at least a performance aspect of the integrated circuit design by using at least some of the soft rules where the first g-cell is determined not to be overcongested in the act of determining whether the first g-cell is overcongested, wherein the marking of the first g-cell indicates what rule the first g-cell is to be based at least in part upon during a routing of the integrated circuit design; and
   a non-transitory tangible computer readable medium or a storage device configured for storing a result produced by the means for identifying the marking of the first g-cell for use in subsequent routing or a display apparatus configured for displaying, the result.

40. The system of claim 39, in which the at least one processor programmed for determining whether the first g-cell is overcongested is further programmed for:
   identifying a route in the first g-cell;
   identifying whether the marking of the first g-cell is using hard rule or using soft rule;
   determining a pitch contribution to the first g-cell based at least in part upon the marking of the first g-cell; and
   adjusting a pitch in the first g-cell according to the pitch contribution.

41. The system of claim 39, in which the at least one processor is further programmed for:
   reevaluating congestion of the first g-cell after marking the g-cell as using soft rule;
   marking congestion based at least in part upon a result of the reevaluating action;
   rerouting a route in a second g-cell in accordance with a result of the marking congestion action;
   determining whether the second g-cell is overcongested; and
   marking the second g-cell as using soft rule, in which the second g-cell is determined not to be overcongested.

42. The system of claim 39, the at least one processor being further programmed for:
   merging the first g-cell determined to be overcongested with a third g-cell until a second criterion is met to form a fourth g-cell, in which the third g-cell is adjacent to the first g-cell;
   determining whether the fourth g-cell inherits marking of design rule from the first g-cell;
   identifying a marking of design rule for the fourth g-cell;
   performing global routing in the fourth g-cell;
   evaluating congestion of the fourth g-cell based at least in part on a second corresponding soft rule; and
   determining whether the fourth g-cell is overcongested based at least in part upon a result of the action of evaluating congestion of the fourth g-cell based at least in part on the second corresponding soft rule.

43. The system of claim 39, in which the at least one processor is further programmed for:
  determining a routing demand of the first g-cell;
  determining a routing capacity of the first g-cell; and
  identifying the first g-cell as overcongested based at least in part upon the routing demand and the routing capacity.

44. The system of claim 39, the at least one processor is further programmed for:
  uncoarsening the first g-cell determined not to be overcongested until a fourth criterion is met to form a set of g-cells comprising a seventh g-cell; and
  uncoarsening the first g-cell determined not to be overcongested until a fourth criterion is met to form a set of g-cells comprising a seventh g-cell.

45. The system of claim 44, the at least one processor is further programmed for:
  determining whether the seventh g-cell inherits a marking of design rule from the first g-cell;
  identifying a marking of design rule for the seventh g-cell;
  performing global routing in at least the seventh g-cell;
  evaluating congestion of the seventh g-cell under a third corresponding soft rule; and
  determining, under the third corresponding soft rule, whether the seventh g-cell is overcongested based at least in part upon the congestion of the seventh g-cell.

46. A computer program product comprising a non-transitory computer-usable storage medium having executable code which, when executed by a processor, causes the processor to execute a process for determining whether to use the hard rules or whether to use the preferred rules for a first g-cell during global routing of an integrated circuit design, the process comprising:
  performing global routing with one or more hard rules which comprise a first requirement for a routing demand and guide the global routing;
  determining, by using at least one processor, whether a first g-cell in the global routing is overcongested by at least using one or more of the soft rules, wherein the one or more of the soft rules comprise a second requirement for the routing demand and are not the hard rules;
  identifying or creating a marking of the first g-cell as using soft rule to improve at least a performance aspect of the integrated circuit design by using at least some of the soft rules where the first g-cell is determined not to be overcongested in the ac of determining whether the first g-cell is overcongested, wherein the marking of the first g-cell indicates what rule the first g-cell is to be based at least in part upon during a routing of the integrated circuit; and
  storing a result of the act of identifying the marking of the first g-cell in a non-transitory tangible computer accessible storage medium for use in subsequent routing or displaying the result on a display apparatus.

47. The computer program product of claim 46, in which act of determining whether the first g-cell is overcongested further comprises:
  identifying a route in the first g-cell;
  identifying whether the marking of the first g-cell is using hard rule or using soft rule;
  determining a pitch contribution to the first g-cell based at least in part upon the marking of the first g-cell; and
  adjusting a pitch in the first g-cell according to the pitch contribution.

48. The computer program product of claim 46, the process further comprising:
  reevaluating congestion of the first g-cell after marking the g-cell as using soft rule;
  marking congestion based at least in part upon a result of the reevaluating action;
  rerouting a route in a second g-cell in accordance with a result of the marking congestion action;
  determining whether the second g-cell is overcongested; and
  marking the second g-cell as using soft rule, in which the second g-cell is determined not to be overcongested.

49. The computer program product of claim 46, further comprising:
  merging the first g-cell determined to be overcongested with a third g-cell until a second criterion is met to form a fourth g-cell, in which the third g-cell is adjacent to the first g-cell;
  determining whether the fourth g-cell inherits marking of design rule from the first g-cell;
  identifying a marking of design rule for the fourth g-cell;
  performing global routing in the fourth g-cell;
  evaluating congestion of the fourth g-cell based at least in part on a second corresponding soft rule; and
  determining whether the fourth g-cell is overcongested based at least in part upon a result of the action of evaluating congestion of the fourth g-cell based at least in part on the second corresponding soft rule.

50. The computer program product of claim 46, further comprising:
  determining a routing demand of the first g-cell;
  determining a routing capacity of the first g-cell; and
  identifying the first g-cell as overcongested based at least in part upon the routing demand and the routing capacity.

51. The computer program product of claim 46, further comprising:
  uncoarsening the first g-cell determined not to be overcongested until a fourth criterion is met to form a set of g-cells comprising a seventh g-cell; and
  uncoarsening the first g-cell determined not to be overcongested until a fourth criterion is met to form a set of g-cells comprising a seventh g-cell.

52. The computer program product of claim 51, further comprising:
  determining whether the seventh g-cell inherits a marking of design rule from the first g-cell;
  identifying a marking of design rule for the seventh g-cell;
  performing global routing in at least the seventh g-cell;
  evaluating congestion of the seventh g-cell under a third corresponding soft rule; and
  determining, under the third corresponding soft rule, whether the seventh g-cell is overcongested based at least in part upon the congestion of the seventh g-cell.

53. The computer-implemented method of claim 1, further comprising:
  performing detailed routing based at least in part upon the marking of the first g-cell as using soft rule rather than involving a rip-up and reroute process for a portion of the integrated circuit design, wherein at least one of the one or more of the soft rules increases the routing demand in a portion of the integrated circuit design comprising the first g-cell.

* * * * *